(12) United States Patent
Kassela et al.

(10) Patent No.: US 9,865,440 B1
(45) Date of Patent: Jan. 9, 2018

(54) SPUTTERING SHIELD

(75) Inventors: Stan Kassela, Singapore (SG); Wei Xu, Singapore (SG); Lim Boon Leong, Singapore (SG); Liu Hao Jun, Singapore (SG); Chun Wai Tong, Singapore (SG); Weilu H. Xu, San Jose, GA (US); Thomas Larson Greenberg, Berkeley, CA (US); Antonio Javier Zambano, San Jose, CA (US); Robin Andrew Davies, Livemore, CA (US)

(73) Assignee: Seagate Technology LLC, Cupertino, CA (US)

(*) Notice: Subject to any disclaimer, the term of this patent is extended or adjusted under 35 U.S.C. 154(b) by 819 days.

(21) Appl. No.: 12/955,851

(22) Filed: Nov. 29, 2010

(51) Int. Cl.
*H01J 37/34* (2006.01)
*C23C 14/34* (2006.01)

(52) U.S. Cl.
CPC ................. *H01J 37/3447* (2013.01)

(58) Field of Classification Search
CPC .. H01J 37/3441; H01J 37/3447; C23C 14/564
USPC ............. 204/298.11, 298.07, 298.14
See application file for complete search history.

(56) References Cited

U.S. PATENT DOCUMENTS

| 4,946,576 A * | 8/1990 | Dietrich et al. ......... 204/298.06 |
| 5,130,005 A | 7/1992 | Hurwitt et al. |
| 5,254,236 A * | 10/1993 | Kinokiri et al. ......... 204/298.11 |
| 5,736,019 A * | 4/1998 | Bernick .................... 204/298.07 |
| 6,149,784 A | 11/2000 | Su et al. |
| 6,837,974 B2 * | 1/2005 | Lawson et al. .......... 204/298.11 |
| 2004/0031680 A1* | 2/2004 | Miller et al. ............. 204/298.11 |
| 2004/0232415 A1* | 11/2004 | Aoki et al. ...................... 257/53 |

FOREIGN PATENT DOCUMENTS

JP 08-232064 * 9/1996
JP 2000-336477 * 12/2000

OTHER PUBLICATIONS

Machine Translation dated Dec. 2000.*
Machine Translation JP 08-232064 dated Sep. 1996.*

* cited by examiner

*Primary Examiner* — Rodney McDonald

(57) ABSTRACT

A sputtering apparatus includes a sputtering cathode and a target overlying the sputtering cathode. A shield overlies the target and forms an aperture configured to direct sputtering particles onto a substrate. The shield includes a lower shield portion overlying the target, a channel outlet overlying the lower shield portion, and an upper shield portion overlying the channel. In some embodiments the shield includes a first shield and a second shield. The first shield includes a front gas injection outlet. The second shield overlies the first shield and forms the aperture. In various embodiments, the second shield is operable to adjust plasma confinement between the first shield and the second shield.

24 Claims, 8 Drawing Sheets

SPUTTERING SHIELD

FIELD

Embodiments according to the present invention generally relate to sputtering equipment.

BACKGROUND

Generally speaking, sputtering is a process carried out in a vacuum chamber that is filled with selected gasses. The sputtering process causes a substrate to be coated with a material from a target located within the sputtering equipment. Electrons in the chamber strike and ionize an inert gas, forming positive ions. The positive ions are then attracted to the negative target. When the ions strike the target, the ions transfer energy to the target material, causing material from the target surface to eject. Some of the ejected material adheres to and coats the surface of the substrate, commonly positioned opposite the target.

Depending on the plasma concentration, target redeposition, and other factors including sputtering, the target can develop disturbances, e.g. flakes, particles, defects, etc., that can lead to premature target replacement. Target replacement is among the reasons for unscheduled downtime faced by sputter departments.

BRIEF DESCRIPTION OF THE DRAWINGS

Embodiments of the present invention are illustrated by way of example, and not by way of limitation, in the figures of the accompanying drawings.

DETAILED DESCRIPTION

Reference will now be made in detail to embodiments, examples of which are illustrated in the accompanying drawings. While the embodiments will be described in conjunction with the drawings, it will be understood that they are not intended to limit the embodiments. On the contrary, the embodiments are intended to cover alternatives, modifications and equivalents. Furthermore, in the following detailed description, numerous specific details are set forth in order to provide a thorough understanding. However, it will be recognized by one of ordinary skill in the art that the embodiments may be practiced without these specific details. In other instances, well-known methods, procedures, components, and circuits have not been described in detail as not to unnecessarily obscure aspects of the embodiments.

For expository purposes, the term "horizontal" as used herein refers to a plane parallel to the plane or surface of a substrate, regardless of its orientation. The term "vertical" refers to a direction perpendicular to the horizontal as just defined. Terms such as "above," "below," "bottom," "top," "side," "higher," "lower," "upper," "over," and "under" are referred to with respect to the horizontal plane.

Figure 1:
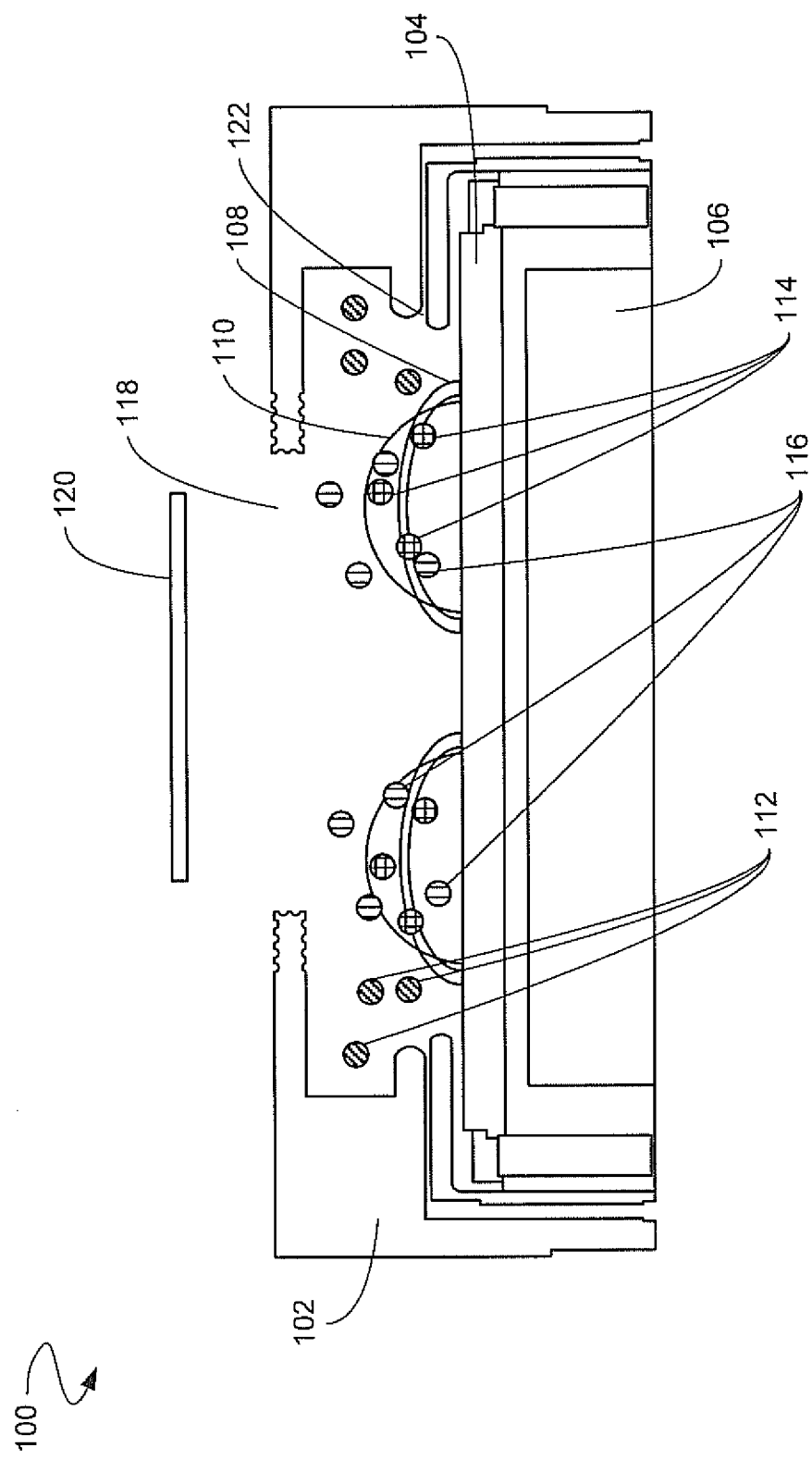
FIG. 1 is a cross section of a sputtering apparatus with a front gas injection shield, according to an embodiment of the present invention.

FIG. 1 is a cross section of a sputtering apparatus 100 with a front gas injection shield 102, according to an embodiment of the present invention. The front gas injection shield 102 directs the flow of gas such that the gas flows and is directed through a passage or vent partially formed by the front gas injection shield 102. In addition, the front gas injection shield 102 directs the flow of gas over the surface of a target 104, instead of directly on the target 104.

The target 104 overlies a sputtering cathode 106. In an embodiment, the sputtering cathode 106 may be one or more rotating magnetron sputtering cathodes. The sputtering cathode 106 creates magnetic fields 108 overlying the target 104. Plasma 110 is confined by the magnetic fields 108. Electrons 112 strike atoms within the plasma 110, forming ions 114. In an embodiment, the ions may be positively charged ions.

The ions 114 are attracted towards the target 104. The ions 114 strike the surface of the target 104, releasing target material 116 from the target 104. The front gas injection shield 102 directs the target material 116 through an aperture 118 and onto a substrate 120. The target material 116 collects on the substrate 120, forming a thin film (not shown). Thus, the substrate 120 overlies the aperture 118. In some embodiments, the diameter of the aperture 118 is greater than or equal to the diameter of the substrate 120.

In various embodiments, a reactive gas (not shown), e.g. oxygen, is added within the sputtering apparatus 100 through a front gas injection outlet 122. The reactive gas may combine with the target material 116 before collecting on the substrate 120. However, the reactive gas may also combine with the surface of the target 104, forming imperfections (not shown) in the target 104. For example, oxygen may oxidize the target 104, making the target 104 prone to flake. The imperfections negatively affect the quality and efficiency of thin film formation on the substrate 120.

Figure 2:
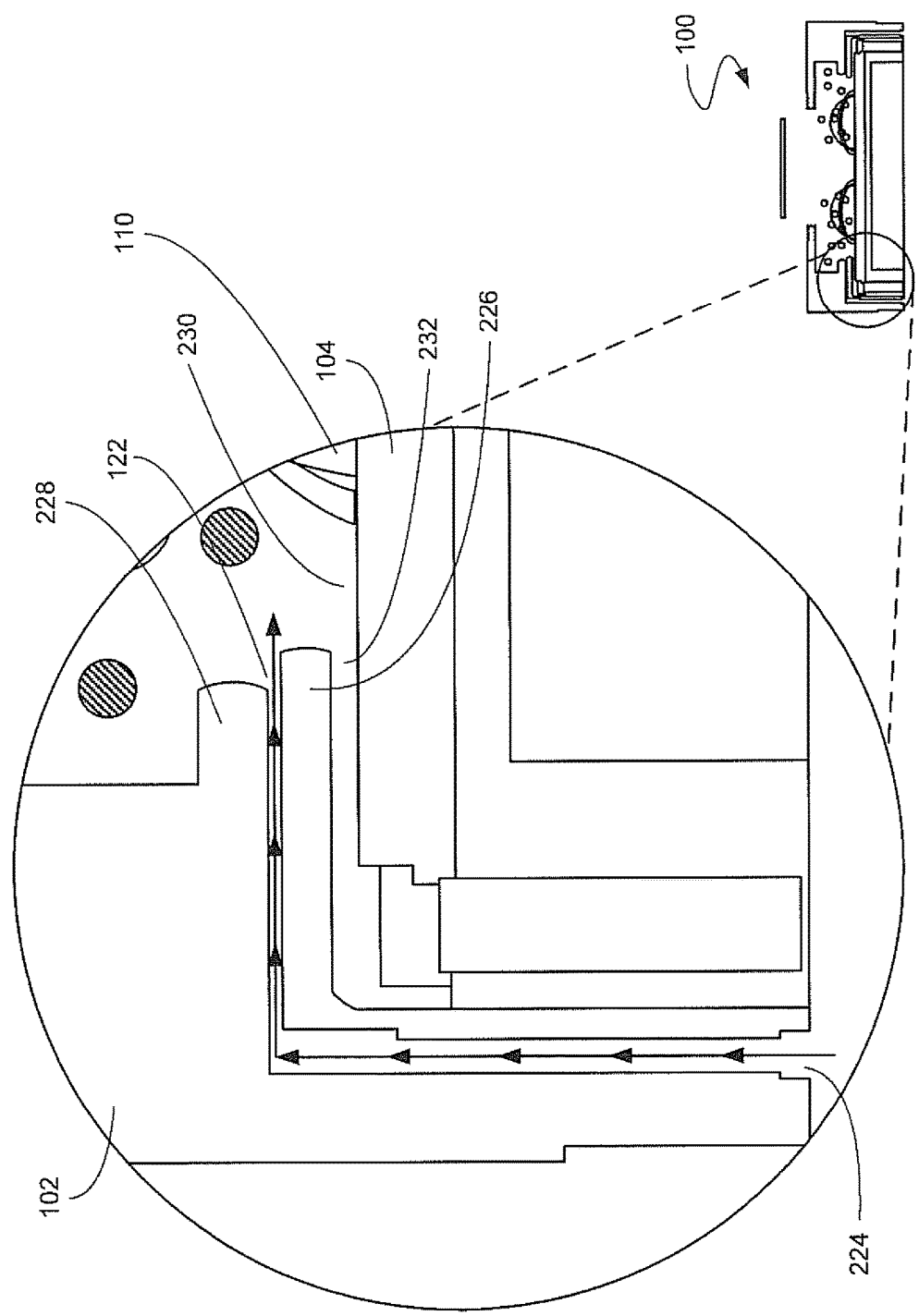
FIG. 2 is a magnified cross sectional portion of the sputtering apparatus of FIG. 1, according to an embodiment of the present invention.

FIG. 2 is a magnified cross sectional portion of the sputtering apparatus 100, according to an embodiment of the present invention. The front gas injection shield includes a lower shield portion 226 and an upper shield portion 228. In addition, the front gas injection shield includes a gas channel 224 disposed between the lower shield portion 226 and the upper shield portion 228.

Gas is added to the sputtering apparatus 100, through the gas channel 224 (and illustrated by arrows) in the front gas injection shield 102. The gas exits the gas channel 224 through the front gas injection outlet 122. In an embodiment, the gas channel 224 is textured, e.g. bead blast textured and/or arc-spray textured. Texturing may prevent redeposition build up from returning back to the plasma 110 and/or target 104 and creating imperfections.

The front gas injection outlet 122 overlies the lower shield portion 226. The upper shield portion 228 overlies the front gas injection outlet 122. In an embodiment, the lower shield portion 226 may be a redeposition shield. Thus, the gas is not added directly on the surface of the target 104. Instead, the gas is added over the target 104 and away from an inside region 230. Therefore, when a reactive gas is added through the front gas injection outlet 122 and away from the surface of the target 104, imperfections are less likely to form on the target 104.

In an embodiment, the lower shield portion 226 is in close proximity, e.g. 0.08 inches, to the target 104, thus forming a dark space 232 overlying the target 104. The dark space 232 may prevent the plasma 110 from leaking under the front gas injection shield 102. In addition, the dark space 232 may help to confine sputtering within the front gas injection shield 102 and on the substrate 120 (See FIG. 1).

Figure 3:
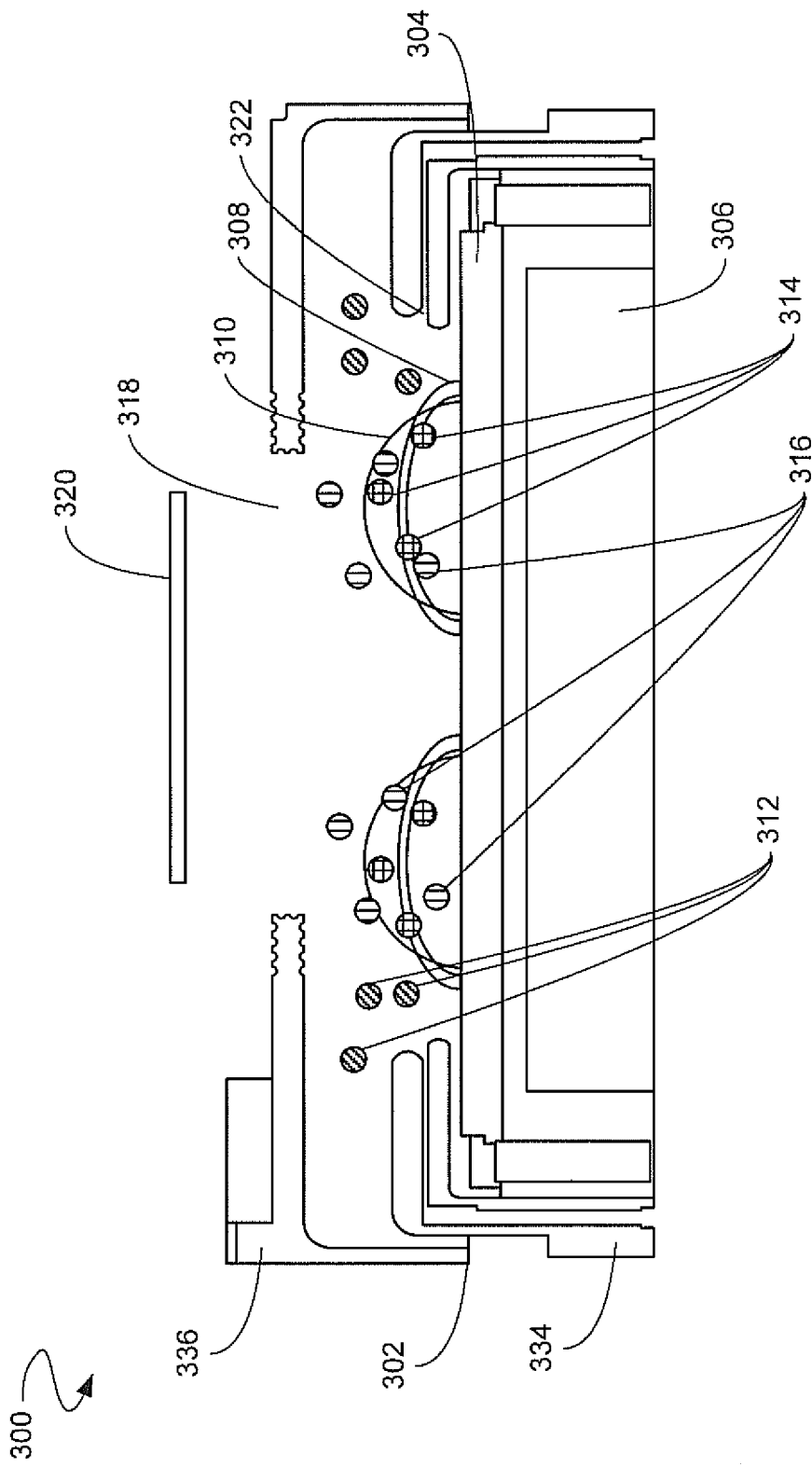
FIG. 3 is a cross section of a sputtering apparatus with an enhanced plasma shield, according to another embodiment of the present invention.

FIG. 3 is a cross section of a sputtering apparatus 300 with an enhanced plasma shield 302, according to another embodiment of the present invention. The enhanced plasma shield 302 directs the flow of gas through the enhanced plasma shield 302, and over the surface of a target 304. In addition, the enhanced plasma shield 302 is operable to adjust confinement of plasma 310.

The target 304 overlies a sputtering cathode 306, e.g. a rotating magnetron sputtering cathode. The sputtering cathode 306 creates magnetic fields 308 overlying the target 304. The plasma 310 is confined by the magnetic fields 308. Electrons 312 strike atoms within the plasma 310, forming ions 314, e.g. positively charged ions.

The ions 314 are attracted towards the target 304. The ions 314 strike the surface of the target 304, releasing target material 316 from the target 304. The enhanced plasma shield 302 directs the target material 316 through an aperture 318 and onto a substrate 320. The target material 316 collects on the substrate 320, forming a thin film (not shown). Thus, the substrate 320 overlies the aperture 318. In some embodiments, the diameter of the aperture 318 is greater than or equal to the diameter of the substrate 320.

The enhanced plasma shield 302 may include two shield portions, a first shield 334 overlying the target 304 and a second shield 336 overlying the first shield 334. The first shield 334 includes a front gas injection outlet 322. Thus, the first shield 334 is a source shield that is decoupled from the aperture 318. The second shield 336 includes the aperture 318.

In addition, it is appreciated that the height of the second shield 336 may be adjusted, thus changing the relative distance between the first shield 334 and the second shield 336. By changing the height of the second shield 336, containment of the plasma 310 within the magnetic fields 308 may be adjusted and thereby tuned. Tuning confinement of the plasma 310 provides additional control over sputtering of the target 304.

Other tunable variables may include temperature, pressure, materials, and distance to the substrate. For example, concentrating the plasma 310 may increase the sputtering reaction, and tuning the pressure of the gas and the voltage of the sputtering cathode 306 may also affect the sputtering reaction. However, continuing to increase the concentration the plasma 310, for example, may inhibit sputtering. Therefore, for each sputtering reaction there are optimal variables that can be selected for efficiency and quality.

Figure 4:
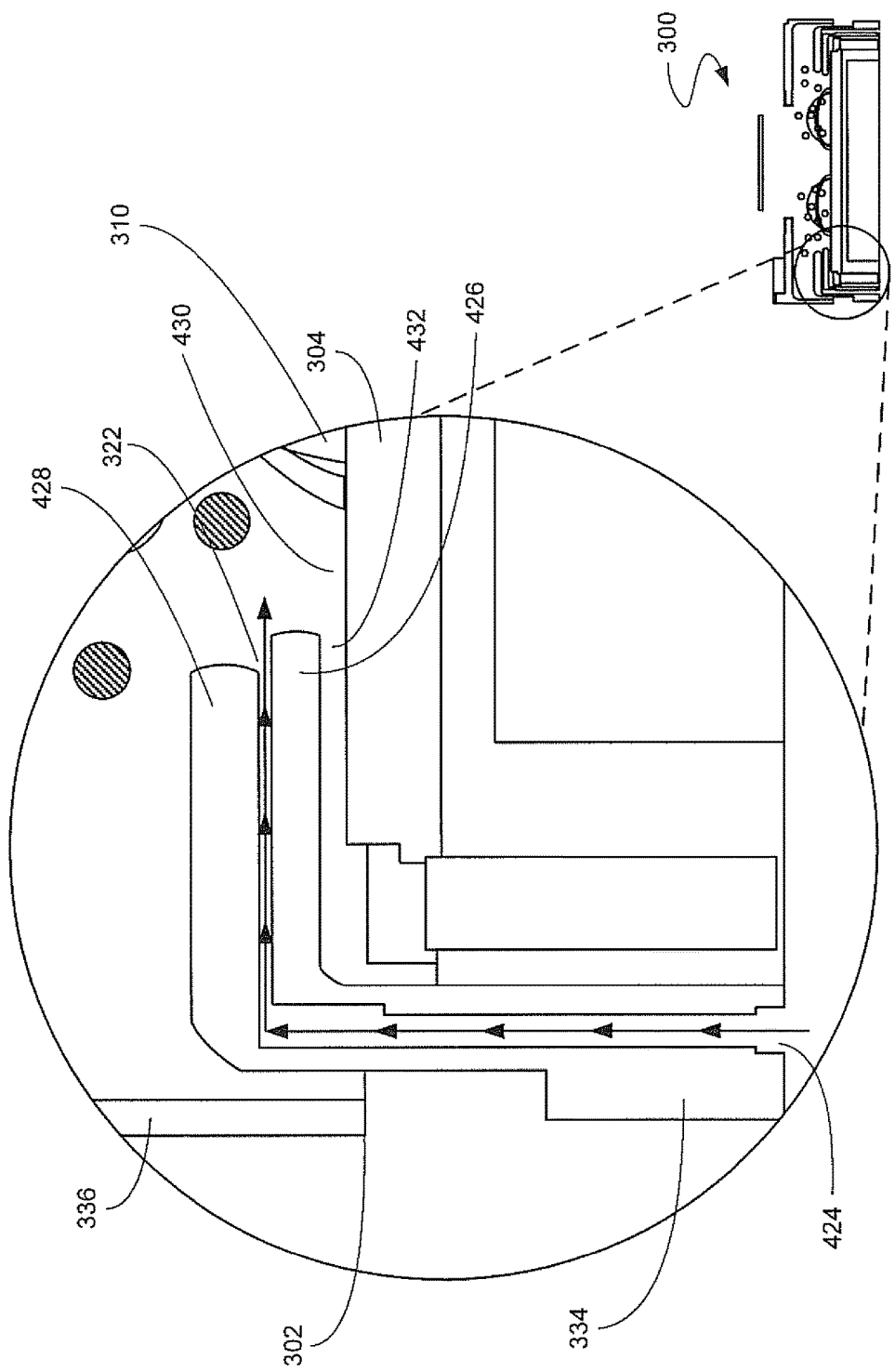
FIG. 4 is a magnified cross sectional portion of the sputtering apparatus of FIG. 2, according to an embodiment of the present invention.

FIG. 4 is a magnified cross sectional portion of the sputtering apparatus 300, according to an embodiment of the present invention. Gas is added to the sputtering apparatus 300, through a gas channel 424 (and illustrated by arrows) in the first shield 334. The gas exits the gas channel 424 through the front gas injection outlet 322. In an embodiment the gas channel 424 is textured, e.g. bead-blast textured and/or arc-spray textured. Texturing may reduce redeposition build up from returning back to the plasma 310 and/or target 304 and creating imperfections.

The first shield 334 includes an upper shield portion 428 and a lower shield portion 426. The front gas injection outlet 322 overlies the lower shield portion 426. The upper shield portion 428 overlies the front gas injection outlet 322. In an embodiment, the lower shield portion 426 may be a redeposition shield. In an embodiment, the redeposition shield reduces redeposition of the target material 316 (see FIG. 3) onto the target 304 by shielding the target 304 and providing an alternate surface for redeposition.

The upper shield portion 428, the front gas injection outlet 322, and the lower shield portion 426 prevent gas from being added directly on the surface of the target 304. Instead, the gas is injected over the target 304 and away from an inside region 430. Therefore, when a reactive gas is added through the front gas injection outlet 322 and away from the surface of the target 304, imperfections are less likely to form on the target 304.

In an embodiment, the lower shield portion 426 is in close proximity, e.g. 0.08 inches, to the target 304, thus forming a dark space 432 overlying the target 304. The dark space 432 may prevent the plasma 310 from leaking under the first shield 334. In addition, the dark space 432 may help to confine sputtering within the enhanced plasma shield 302 and on the substrate 320 (See FIG. 3).

Figure 5:
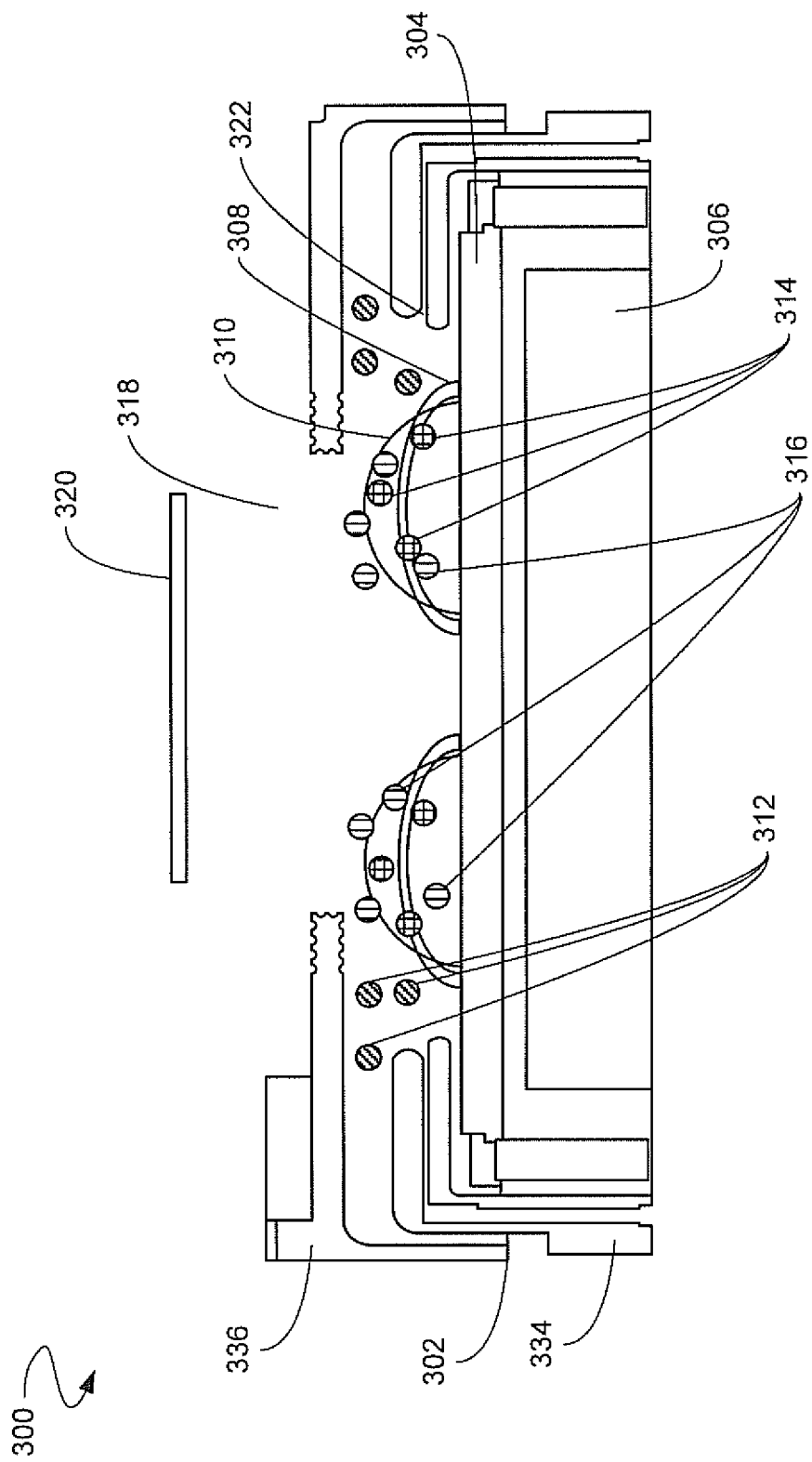
FIG. 5 is a cross section of the sputtering apparatus of FIG. 2 with a first shield adjusted to a closer position relative to a second shield, according to an embodiment of the present invention.

FIG. 5 is a cross section of the sputtering apparatus 300 with the first shield 334 adjusted to a closer position relative to the second shield 336, according to an embodiment of the present invention. Thus in FIG. 5, the first shield 334 and the second shield 336 are closer together than in FIG. 3.

In an embodiment, the closer proximity of the first shield 334 and the second shield 336 may concentrate the plasma 310. Concentration of the plasma 310 may increase the formation of the ions 314, and therefore may increases the rate of the collection of the target material 316 on the substrate 320.

Figure 6:
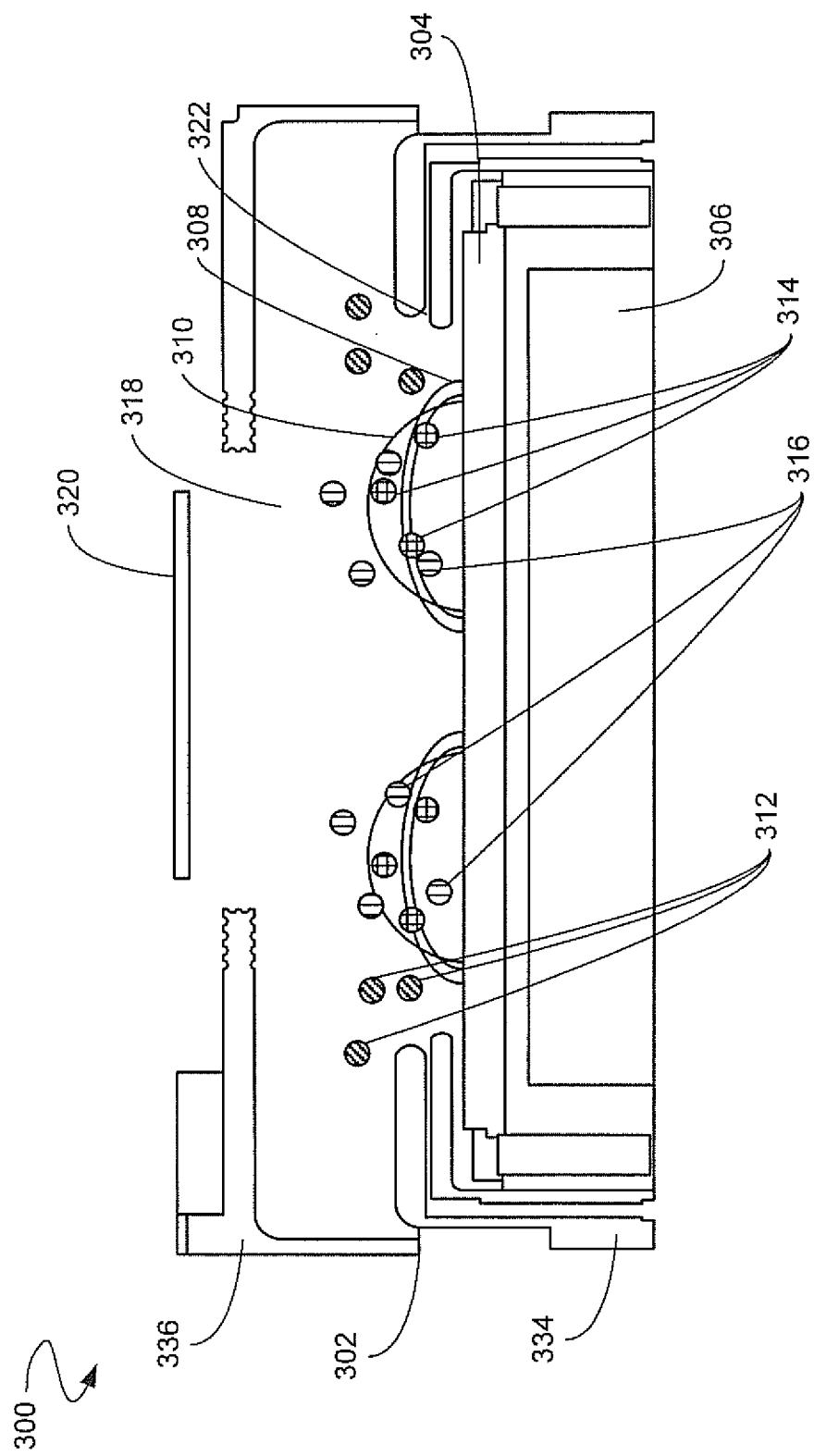
FIG. 6 is a cross section of the sputtering apparatus of FIG. 2 with the first shield adjusted to a further position relative to the second shield, according to an embodiment of the present invention.

FIG. 6 is a cross section of the sputtering apparatus 300 with the first shield 334 adjusted to a further position relative to the second shield 336, according to an embodiment of the present invention. Thus in FIG. 6, the first shield 334 and the second shield 336 are further apart than in FIG. 3.

In an embodiment, the further proximity of the first shield 334 and the second shield 336 may reduce the concentration the plasma 310. The reduced concentration of the plasma 310 may decrease the formation of the ions 314, and therefore may decrease the rate of the collection of the target material 316 on the substrate 320.

Figure 7:
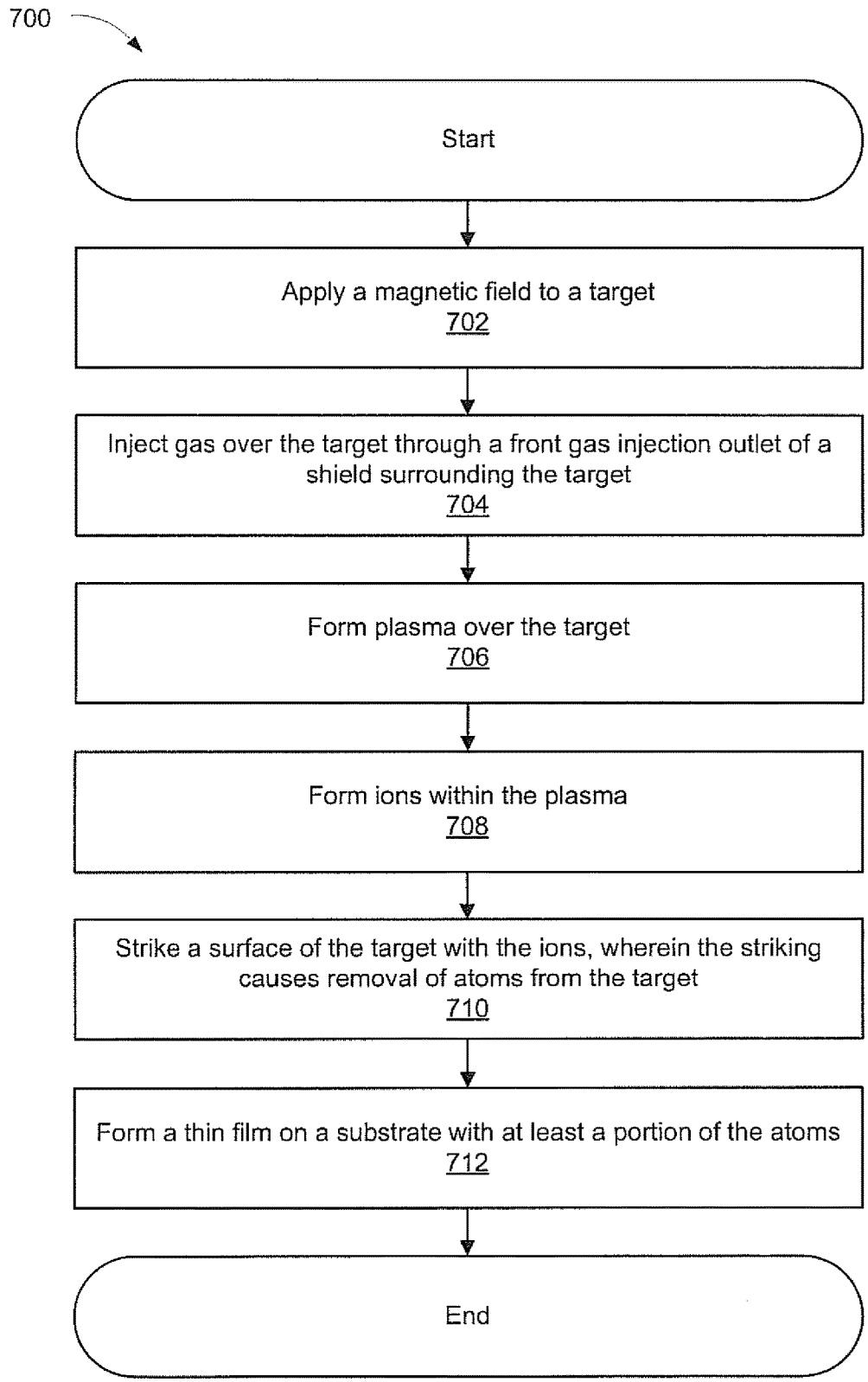
FIG. 7 depicts a flowchart of an exemplary process of sputtering according to an embodiment of the present invention.

FIG. 7 depicts a flowchart 700 of a process of sputtering according to an embodiment of the present invention. In block 702, a magnetic field is applied to a target. For example, in FIG. 1 a target overlies a sputtering cathode. The sputtering cathode forms a magnetic field over the target. In an embodiment the sputtering cathode is a rotating magnetron sputtering cathode.

In block 704, gas is injected over the target through a front gas injection outlet of a shield surrounding the target. For example, in FIG. 1 a shield overlies the target. The shield includes a lower shield portion overlying the target, a channel outlet overlying the lower shield portion, and an upper shield portion overlying the channel. In an embodiment the lower shield portion is a redeposition shield portion, the channel outlet is a front gas injection outlet, and the channel outlet is operatively connected to a gas channel. In some embodiments the gas channel is bead blast textured and/or arc spray textured.

In a further embodiment, the injecting includes injecting the gas through the shield, and the shield includes the front gas injection outlet. For example, in FIG. 3 a first shield overlies the target and includes a front gas injection outlet. The first shield includes a redeposition shield portion, and the front gas injection outlet overlies the redeposition shield portion. In some embodiments the front gas injection outlet prevents at least a portion of the target from oxidizing. Various embodiments include a dark space between the shield and the target.

In block 706, plasma is formed over the target. For example, in FIG. 1 plasma is concentrated within the magnetic fields overlying the target, and the cathode formed the magnetic fields. In some embodiments, the pressure of the gas is tuned and the voltage of the cathode is tuned.

In various embodiments, the confinement of the plasma is adjusted by tuning a distance between the target and the shield. For example, in FIG. 3 a second shield overlies the first shield. The second shield is operable to displace in order to change a relative distance between the first shield and the second shield. Thus, the first shield is a lower shield, the second shield is an upper shield, and the lower shield and upper shield overlie the target. The distance between the lower shield and the upper shield may be adjusted in order to adjust the plasma confinement between the first shield and the second shield.

In block 708, ions are formed within the plasma. For example in FIG. 1, positively charged ions form within the plasma and are attracted to the surface of the target by a negatively charged cathode.

In block 710, the ions strike a surface of the target, wherein the striking causes removal of atoms from the target. For example, in FIG. 1 the ions strike the surface of the target. The force of the striking causes target material to be released from the target.

In a block 712, a thin film is formed on a substrate with at least a portion of the atoms. For example, in FIG. 1 the shield forms an aperture configured to direct sputtering particles onto the substrate, and in FIG. 2 the second shield forms an aperture. The substrate is operable to overlie the aperture. The aperture includes an aperture diameter and the substrate includes a substrate diameter. In some embodiments, the aperture diameter is greater than or equal to the substrate diameter. Substrate particles travel through the aperture and collect on the substrate, forming a thin film on the substrate.

Figure 8:
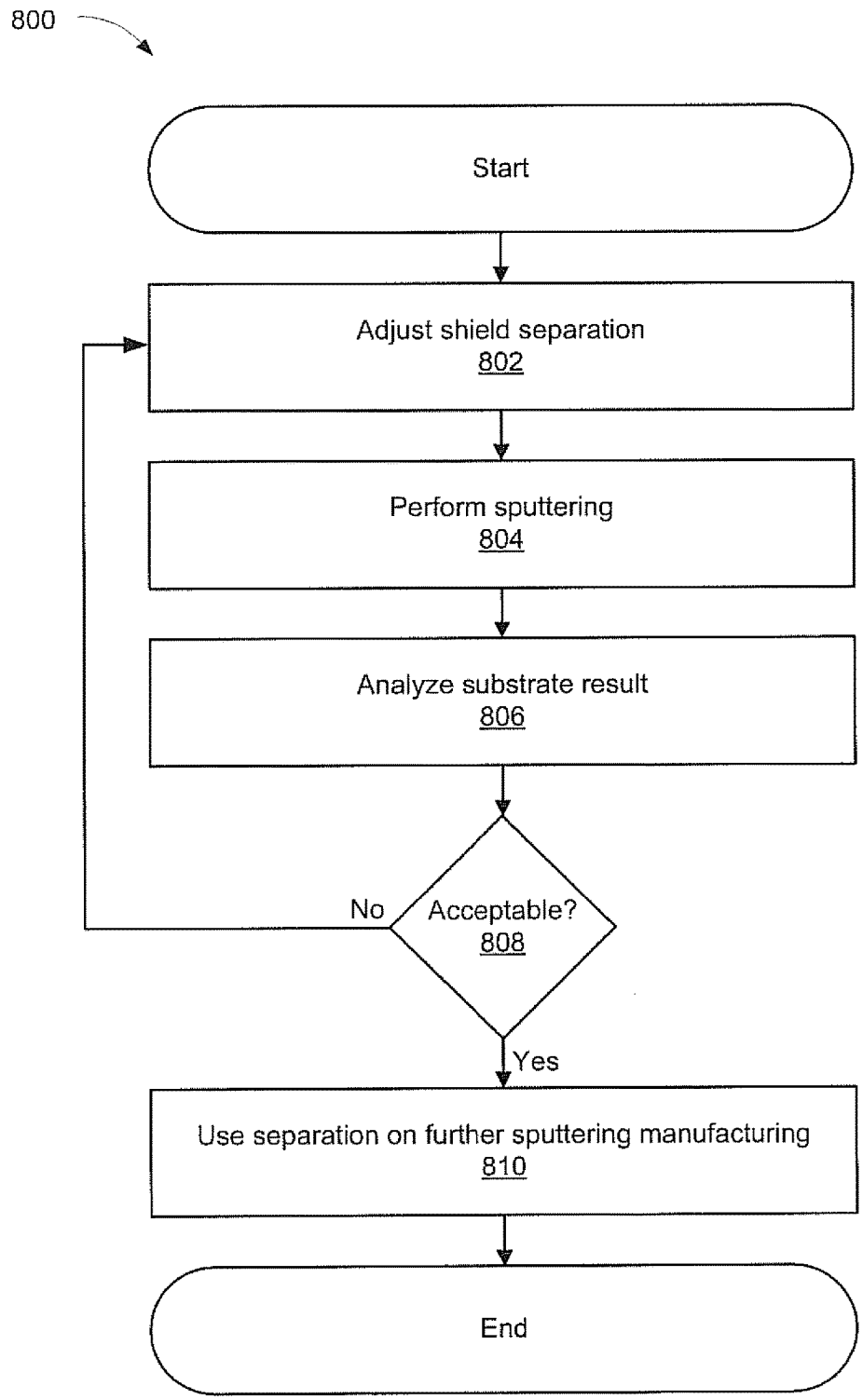
FIG. 8 depicts a flowchart of an exemplary process of sputtering according to some embodiments of the present invention.

FIG. 8 depicts a flowchart 800 of a process of sputtering according to some embodiments of the present invention. In a block 802, shield separation is adjusted. For example, FIGS. 3, 5 and 6 depict alternate adjustments of the first shield relative to the second shield. Thus the first shield may be adjusted to be closer or further away from the second shield. In a block 804, sputtering is performed. For example, in FIG. 3 sputtering is performed on a substrate within a sputtering apparatus.

In a block 806, the substrate is analyzed to determine the result of the sputtering. In a block 808, if the results of the sputtering are unacceptable, then the process returns to block 802 and the shield separation is adjusted again. However, if the results of the sputtering are acceptable, then the process proceeds to block 810. In a block 810, the separation is used on further sputtering manufacturing.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings.

What is claimed is:

1. An apparatus comprising:
   a target overlying a sputtering cathode;
   a first shield overlying said target wherein said first shield includes:
      a lower shield portion overlying said target;
      a channel outlet overlying both said lower shield portion and said target; and
      an upper shield portion overlying said channel outlet; and
   a second shield overlying said first shield, wherein said second shield forms an aperture configured to direct sputtering particles directly onto a substrate.

2. The apparatus of claim 1 wherein said first shield includes a redeposition shield portion, and said channel outlet includes a front gas injection outlet.

3. The apparatus of claim 1 further comprising a space between said first shield and said target.

4. The apparatus of claim 1 wherein said sputtering cathode is a rotating magnetron sputtering cathode.

5. The apparatus of claim 1 wherein:
   said aperture includes an aperture diameter;
   said substrate is operable to overlie said aperture;
   said substrate includes a substrate diameter; and
   said aperture diameter is greater than or equal to said substrate diameter.

6. The apparatus of claim 1 further comprising a gas channel operatively connected to said channel outlet.

7. The apparatus of claim 1 wherein said first shield includes a gas channel and said gas channel is textured.

8. An apparatus comprising:
   a target overlying a sputtering cathode;
   a first shield overlying said target, wherein said first shield includes a front gas injection outlet overlying said target, a dark space, a lower shield portion, and an upper shield portion; and
   a second shield overlying said first shield, wherein the second shield forms an aperture configured to direct sputtering particles onto a substrate, and wherein there are no intervening shields between the aperture and the substrate.

9. The apparatus of claim 8 wherein said second shield is operable to displace to change a relative distance between said first shield and said second shield.

10. The apparatus of claim 8 wherein said second shield is operable to adjust plasma confinement between said first shield and said second shield.

11. The apparatus of claim 8 wherein said first shield includes a redeposition shield portion, and wherein further said front gas injection outlet overlies said redeposition shield portion.

12. The apparatus of claim 8 wherein said sputtering cathode is a rotating magnetron sputtering cathode.

13. The apparatus of claim 8 wherein:
   said aperture includes an aperture diameter;
   said substrate is operable to overlie said aperture;
   said substrate includes a substrate diameter; and
   said aperture diameter is greater than or equal to said substrate diameter.

14. The apparatus of claim 8 wherein said first shield includes a gas channel and said gas channel is bead-blast textured and arc-spray textured.

15. A device for implementing a method, said method comprising:

applying a magnetic field to a target;

injecting gas over said target through a front gas injection outlet overlying said target wherein a first shield includes a lower shield portion, said front gas injection outlet, and an upper shield portion;

forming plasma over said target;

forming ions within said plasma;

striking a surface of said target with said ions, wherein said striking causes removal of atoms from said target;

directing at least a portion of said atoms through an aperture formed by a second shield overlying said first shield, wherein said second shield forms an aperture configured to direct sputtering particles onto a substrate, and wherein the aperture is adjacent to the substrate; and forming a thin film on said substrate with at least a portion of said atoms.

16. The device of claim 15 further comprising adjusting a distance between said first shield and said second shield, wherein said first shield and said second shield overlie said target.

17. The device of claim 15 further comprising adjusting confinement of said plasma by tuning a distance between said target and said first shield.

18. The device of claim 15 wherein said injecting includes injecting said gas through said first shield, and said first shield includes said front gas injection outlet.

19. The device of claim 15 wherein said front gas injection outlet prevents at least a portion of said target from oxidizing.

20. The device of claim 15 further comprising tuning pressure of said gas and tuning voltage of a cathode, wherein said cathode forms said magnetic field.

21. The apparatus of claim 1, wherein the aperture of the second shield is narrower than an aperture of the first shield.

22. The apparatus of claim 8, wherein the aperture of the second shield is narrower than an aperture of the first shield.

23. The device of claim 15, wherein the aperture of the second shield is narrower than an aperture of the first shield.

24. The apparatus of claim 1, further comprising:

a first aperture formed by the lower shield portion;

a second aperture formed by the upper shield portion wherein the second aperture is wider than the first aperture; and a third aperture formed by the second shield and configured to overlie the first shield and further configured to direct the sputtering particles onto a substrate overlying the third aperture.

* * * * *

UNITED STATES PATENT AND TRADEMARK OFFICE
CERTIFICATE OF CORRECTION

PATENT NO. : 9,865,440 B1  
APPLICATION NO. : 12/955851  
DATED : January 9, 2018  
INVENTOR(S) : Kassela et al.

Page 1 of 1

It is certified that error appears in the above-identified patent and that said Letters Patent is hereby corrected as shown below:

On the Title Page

Item (75), in the listing of Inventors:  
After Chun Wai Tong, delete "Singapore (SG)" and insert -- San Jose, CA (US) --, therefor,  
After Wilu H. Xu, delete "San Jose, GA (US)" and insert -- San Jose, CA (US) --, therefor.

Signed and Sealed this  
Thirty-first Day of July, 2018

Andrei Iancu  
*Director of the United States Patent and Trademark Office*